United States Patent
Choi et al.

(10) Patent No.: US 9,397,317 B2
(45) Date of Patent: Jul. 19, 2016

(54) ORGANIC LIGHT-EMITTING TRANSISTOR AND ORGANIC LIGHT EMITTING DISPLAY APPARATUS

(71) Applicant: SAMSUNG DISPLAY CO., LTD., Yongin, Gyeonggi-Do (KR)

(72) Inventors: Dae-Sung Choi, Yongin (KR); Won-Sang Park, Yongin (KR)

(73) Assignee: SAMSUNG DISPLAY CO., LTD., Yongin (KR)

( * ) Notice: Subject to any disclaimer, the term of this patent is extended or adjusted under 35 U.S.C. 154(b) by 418 days.

(21) Appl. No.: 13/786,821

(22) Filed: Mar. 6, 2013

(65) Prior Publication Data
US 2014/0043307 A1 Feb. 13, 2014

(51) Int. Cl.
G06F 3/038 (2013.01)
H01L 51/52 (2006.01)
G09G 3/32 (2016.01)
H01L 51/05 (2006.01)
G09G 3/20 (2006.01)

(52) U.S. Cl.
CPC .......... *H01L 51/5296* (2013.01); *G09G 3/3283* (2013.01); *H01L 51/0554* (2013.01); *G09G 3/2074* (2013.01); *G09G 3/3258* (2013.01); *H01L 2251/53* (2013.01)

(58) Field of Classification Search
USPC ....................................... 345/77, 205; 257/40
See application file for complete search history.

(56) References Cited

U.S. PATENT DOCUMENTS

| | | | |
|---|---|---|---|
| 7,807,997 B2* | 10/2010 | Yamaguchi | 257/48 |
| 2003/0038288 A1* | 2/2003 | Suzuki et al. | 257/72 |
| 2003/0213952 A1* | 11/2003 | Iechi et al. | 257/40 |
| 2005/0024305 A1* | 2/2005 | Park | 345/82 |
| 2006/0082566 A1* | 4/2006 | Akimoto | G09G 3/2007 345/204 |
| 2006/0208962 A1* | 9/2006 | Sekiya | 345/45 |
| 2009/0243482 A1* | 10/2009 | Tohyama et al. | 313/505 |
| 2009/0267075 A1* | 10/2009 | Wang et al. | 257/72 |

FOREIGN PATENT DOCUMENTS

| | | |
|---|---|---|
| KR | 10-2006-0018201 A | 2/2006 |
| KR | 10-2006-0134281 A | 12/2006 |
| KR | 10-2008-0002566 A | 1/2008 |

* cited by examiner

*Primary Examiner* — Jason Olson
*Assistant Examiner* — Sosina Abebe
(74) *Attorney, Agent, or Firm* — Knobbe Martens Olson & Bear LLP

(57) ABSTRACT

Each pixel of the organic light-emitting display apparatus comprises a plurality of sub-pixels by using an organic light-emitting transistor (OLET). The OLET includes a plurality of gate electrodes that have different areas and are arranged adjacent to one another, a plurality of source electrodes and a plurality of drain electrodes, and an organic thin film layer disposed between or below the source electrodes and drain electrodes, the organic thin film layer including an organic light-emitting material, wherein the sub-pixels of the pixel selected by a scan signal are selectively turned-on/off by a data signal to represent a gradation.

21 Claims, 12 Drawing Sheets

ORGANIC LIGHT-EMITTING TRANSISTOR AND ORGANIC LIGHT EMITTING DISPLAY APPARATUS

CROSS-REFERENCE TO RELATED PATENT APPLICATION

This application claims the benefit of Korean Patent Application No. 10-2012-0086390, filed on Aug. 7, 2012, in the Korean Intellectual Property Office, the disclosure of which is incorporated herein in its entirety by reference.

BACKGROUND

1. Field

The present disclosure relates to an organic light-emitting transistor and an organic light-emitting display apparatus.

2. Discussion of the Related Technology

Display apparatuses using an organic light-emitting diode use a phenomenon in which light is emitted through a process in which electrons and holes form electron-hole pairs in a semiconductor or carriers excite to a higher energy state and then drop to a ground state, which is a stabilized state.

However, unlike a liquid crystal display (LCD) apparatus, an organic light-emitting diode is driven in a current driving mode instead of a voltage driving mode. Thus, a separate device for controlling the organic light-emitting diode is required. At least two transistors including a switching transistor for selecting a pixel and a driving transistor for driving an organic light-emitting diode are required as devices for controlling the organic light-emitting diode.

When a display apparatus includes a separate device for controlling an organic light-emitting diode, an area of a pixel is significantly reduced. Also, non-uniformity of a gradation is caused by dispersion of a threshold voltage Vth of a driving transistor by controlling the driving transistor in an analog manner, and this causes a problem to uniformity of the display apparatus. In addition, there is a need for a separate time for compensating for the threshold voltage Vth, and thus a timing problem is caused in an ultra definition (UD) three-dimensional (3D) display apparatus.

SUMMARY

An aspect of the present invention provides a display apparatus in which a single pixel may be formed to have a structure including a plurality of differential sub-pixels by using an organic light-emitting transistor having both a function as a transistor and a light-emitting function, and in which a gradation may be represented through a combination of on/off operations of sub-pixels.

One aspect of the present invention provides an organic light-emitting transistor device including: a plurality of gate electrodes that have areas substantially different from one another and are arranged adjacent to one another; an insulation film formed over the gate electrodes; a plurality of source electrodes that have predetermined areas corresponding to the areas of the gate electrodes, respectively, and are formed over the insulation film and spaced apart from one another to face each other; a plurality of drain electrodes that have predetermined areas corresponding to the areas of the gate electrodes, respectively, and are formed over the insulation film and spaced apart from one another, each of the plurality of drain electrodes facing to one of the plurality of source electrodes; and an organic thin film layer disposed over the insulation film and drain electrodes and including an organic light-emitting material.

The organic thin film layer may be disposed below the source electrodes and the drain electrodes.

The organic thin film layer may include at least a portion formed in the same level as the source electrodes and the drain electrodes to fill gaps between the source electrodes and the drain electrodes.

The organic thin film layer may include an emitting material layer and an active layer.

The organic thin film layer may include an emitting material layer including an organic light-emitting material, and an electron transport layer and a hole transport layer, wherein the emitting material layer is disposed between the electron transport layer and the hole transport layer, wherein the electron transport layer or the hole transport layer is an active layer.

Another aspect of the present invention provides an organic light-emitting transistor including: a plurality of gate electrodes that have areas substantially different from one another and are arranged adjacent to one another; an insulation film formed over the gate electrodes; a plurality of source electrodes disposed over the insulation film to be spaced apart from one another in parallel at substantially equal intervals and to cross the gate electrodes; a plurality of drain electrodes disposed over the insulation film, one of the drain electrodes being disposed between two of the source electrodes; and an organic thin film layer disposed over the insulation film, the organic thin film layer including an organic light-emitting material.

The organic thin film layer may be disposed below the source electrodes and the drain electrodes.

The organic thin film layer may include at least a portion formed in the same level as the source electrodes and the drain electrodes to fill gaps between the source electrodes and the drain electrodes.

The organic thin film layer may include an emitting material layer and an active layer.

The organic thin film layer may include an emitting material layer including an organic light-emitting material, and an electron transport layer and a hole transport layer, wherein the emitting material layer is disposed between the electron transport layer and the hole transport layer, wherein the electron transport layer or the hole transport layer is an active layer.

Still another aspect of the present invention provides an organic light-emitting transistor including: a plurality of gate electrodes that have areas substantially different from one another and are arranged adjacent to one another; a first insulation film formed over the gate electrodes; an active layer formed over the first insulation film; a plurality of source electrodes disposed over the active layer to have a predetermined pattern; a second insulation film formed over the source electrode; an organic thin film layer including a first portion formed on the second insulating film and a second portion filling gaps between the source electrodes, the organic thin film layer including an organic light-emitting material; and a drain electrode formed over the organic thin film layer to be commonly formed over the gate electrodes.

The organic thin film layer may include an emitting material layer including the organic light-emitting material, and an electron transport layer and a hole transport layer, wherein the emitting material layer is disposed between the electron transport layer and the hole transport layer.

The source electrodes may include a plurality of electrode lines that are disposed over the active layer and spaced apart from one another at substantially equal intervals in parallel and to cross the gate electrodes.

The source electrodes may be formed over the active layer in a honeycomb pattern or a lattice pattern.

A further aspect of the present invention provides an organic light-emitting display apparatus including: a scan driver for supplying scan signals to a plurality of scan lines; a data driver for supplying data signals to a plurality of data lines; and a plurality of pixels formed near intersections between the scan lines and the data lines, wherein each of the pixels includes a plurality of sub-pixels by using an organic light-emitting transistor (OLET) device including a plurality of gate electrodes that have areas substantially different from one another and are arranged adjacent to one another, a plurality of source electrodes and a plurality of drain electrodes, and an organic thin film layer disposed over the gate electrode, the organic thin film layer including an organic light-emitting material, wherein the sub-pixels of the pixel selected by a scan signal are selectively turned-on/off by a data signal to represent a gradation.

The gate electrodes of the pixel may be selectively turned-on by the data signal to thus selectively turn on the sub-pixels.

When the number of gate electrodes is N (wherein, N is a natural number), the number of gradations to be represented may be $2^{(N)}$.

A value of the gradation may correspond to the sum of light-emitting areas of the turned-on sub-pixels.

The source electrodes may have predetermined areas corresponding to the areas of the gate electrodes, respectively, and may be spaced apart from one another, wherein the drain electrodes have predetermined areas corresponding to areas of the gate electrodes, respectively, and are spaced apart from one another, wherein each of the drain electrodes faces one of the source electrodes.

The source electrodes may be disposed over the gate electrodes and spaced apart from one another at substantially equal intervals in parallel and to cross the gate electrodes, and one of the drain electrodes may be disposed between two of the source electrodes.

An active layer may be disposed over the gate electrodes, the source electrodes may be disposed over the active layer to be spaced apart from one another at substantially equal intervals in parallel and to cross the gate electrodes, and the drain electrodes may be commonly formed over the source electrodes across the gate electrodes.

An active layer may be formed over the gate electrodes, the source electrodes may be formed in a honeycomb pattern or a lattice pattern, and the drain electrodes may be commonly formed over the source electrodes across the gate electrodes.

BRIEF DESCRIPTION OF THE DRAWINGS

The above and other features and advantages of the present invention will become more apparent by describing in detail embodiments thereof with reference to the attached drawings in which.

DETAILED DESCRIPTION OF EMBODIMENTS

Figure 1:
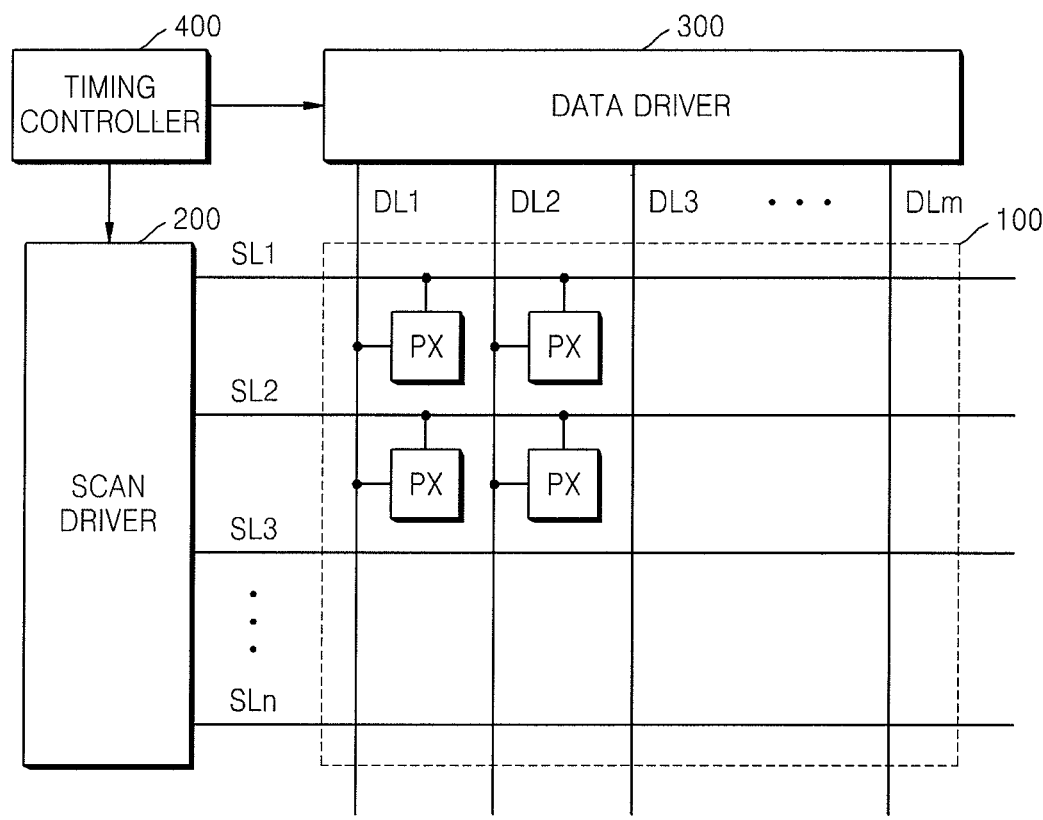
FIG. 1 is a schematic diagram showing a display apparatus according to an embodiment of the present invention.

Various changes in form and details may be made to the present inventive concept and thus should not be construed as being limited to the embodiments set forth herein. The inventive concept is not limited to the embodiments described in the present description, and thus it should be understood that the inventive concept does not include every kind of variation example or alternative equivalent included in the spirit and scope of the inventive concept. Also, while describing the embodiments, detailed descriptions about related well-known functions or configurations that may diminish the clarity of the points of the embodiments of the present invention will be omitted.

In the present description, terms such as 'first', 'second', etc. are used to describe various elements. However, it is obvious that the elements should not be defined by these terms. The terms are used only for distinguishing one element from another element.

In the drawings, lengths and sizes of layers and regions may be exaggerated for clarity. It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

Spatially relative terms, such as "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned-over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Embodiments of the present invention will now be described more fully with reference to the accompanying drawings, in which embodiments of the invention are shown.

FIG. 1 is a schematic diagram showing a display apparatus according to an embodiment of the present invention.

Referring to FIG. 1, the display apparatus includes a light-emitting panel 100, a scan driver 200, a data driver 300, and a timing controller 400.

The light-emitting panel 100 includes a plurality of scan lines SL1-SLn, a plurality of data lines DL1-DLm, and a plurality of pixels PX. The scan lines SL1-SLn are arranged in a row direction to be spaced apart from one another at equal intervals and transmit scan signals. The data lines DL1-DLm are arranged in a column direction to be spaced apart from one another at equal intervals and transmit data signals. The scan lines SL1-SLn and the data lines DL1-DLm are arranged in a matrix array, and a single pixel PX is formed near an intersection between the scan line SL1-SLn and the data line DL1-DLm. The single pixel PX is defined by a plurality of differential sub-pixels, and a gradation is represented by selective light-emission according to on/off operations of the plurality of differential sub-pixels.

The scan driver 200 is connected to the scan lines SL1-SLn of the light-emitting panel 100 to apply scan signals formed of a combination of a gate-on voltage and a gate-off voltage to the scan lines SL1-SLn. Here, the scan driver 200 may apply the scan signals so that a plurality of selection signals respectively applied to the scan lines SL1-SLn sequentially have the gate-on voltage. When the scan signals have the gate-on voltage, a switching transistor connected to the corresponding scan line is turned-on, and thus the corresponding pixel PX is turned-on (selected).

The data driver 300 is connected to the data lines DL1-DLm of the light-emitting panel 100 to apply data signals representing a gradation to the data lines DL1-DLm.

The timing controller 400 receives input image data Data from an external graphic controller (not shown) and an input control signal for controlling displaying of the input image data Data. The input control signal includes, for example, a horizontal synchronization signal Hsync, a vertical synchronization signal Vsync, and a main clock MCLK. The timing controller 400 controls the scan driver 200 and data driver 300 to output signals.

Figure 2:
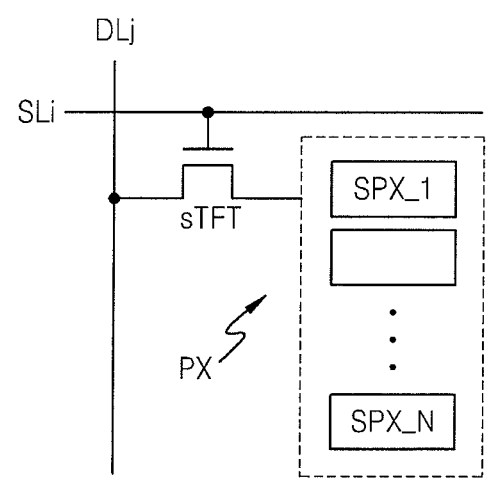
FIG. 2 is a schematic diagram showing a structure of a pixel shown in FIG. 1.

FIG. 2 is a schematic diagram showing a structure of a pixel PX shown in FIG. 1.

Referring to FIG. 2, the pixel PX connected to an i-th scan line SLi (wherein, i is a natural number equal to 1 or greater than n) and a j-th data line DLj (wherein, j is a natural number equal to 1 or less than m) includes a plurality of differential sub-pixels SPX. If a switching transistor sTFT is turned-on by the scan signal applied from the scan line SLi, each pixel PX is coupled to the data line DLj via the switching transistor sTFT, and thus a gradation is represented. In a single pixel, the number of gradations and the number of differential sub-pixels have a relationship as follows.

$$\text{Number of gradations} = 2^{(N)} \text{ (wherein, } N \text{ is the number of differential sub-pixels having different light-emitting areas)}$$

The differential sub-pixel means that the light-emitting areas or the sub-pixels have different sizes, and the differential sub-pixel has a quadrilateral shape. Light-emitting areas of the differential sub-pixel constituting a single pixel may vary according to characteristics of a device and the number of gradations. Video data is converted into a digital signal for turning on/off the differential sub-pixels. Here, when the pixel represents a gradation by the digital signal converted in correspondence to the video data, as the pixel represents a higher gradation, the number of differential sub-pixels to be turned-on increases. In other words, a value of the gradation to be represented corresponds to the sum of the light-emitting areas of the turned-on differential sub-pixels.

For example, when the number of differential sub-pixels constituting a single pixel is six and the six differential sub-pixels have different light-emitting areas, the number of gradations to be represented is $2^6=64$. If two of the six differential sub-pixels have the same light-emitting area, the number of gradations that may be represented is $2^5=32$.

FIGS. 3A to 3E are diagrams showing examples of representing gradation, according to an embodiment of the present invention.

In one embodiment of the present invention, a single pixel is divided into a plurality of differential sub-pixels. Since a size of each sub-pixel is smaller than a resolving power of the eye, the area of the sub-pixel is recognized as brightness. By using this, the gradation may be represented by a combination of on/off operations of each sub-pixel.

FIGS. 3A to 3E show examples in which six light-emitting areas are formed by dividing a single pixel into six differential sub-pixels SPX. In embodiments, a light-emitting area of a fifth differential sub-pixel SPX_5 is formed to be the same as a light-emitting area of a sixth differential sub-pixel SPX_6, and thus thirty-two gradations may be represented. If it is assumed that the gradation is linear, six light-emitting areas may represent thirty-two gradations. However, this is just an example, and thus the six differential sub-pixels may be formed to have different light-emitting areas to represent sixty-four gradations.

Referring to FIGS. 3A to 3E, the fifth and sixth differential sub-pixels SPX_5 and SPX_6 have the same minimum light-emitting area. A light-emitting area of a fourth differential sub-pixel SPX_4 is twice the light-emitting area of the fifth differential sub-pixel SPX_5. A light-emitting area of a third differential sub-pixel SPX_3 is twice the light-emitting area of the fourth differential sub-pixel SPX_4. A light-emitting area of a second differential sub-pixel SPX_2 is twice the light-emitting area of the third differential sub-pixel SPX_3. A light-emitting area of a first differential sub-pixel SPX_1 is twice the light-emitting area of the second differential sub-pixel SPX_2.

Figure 3A:
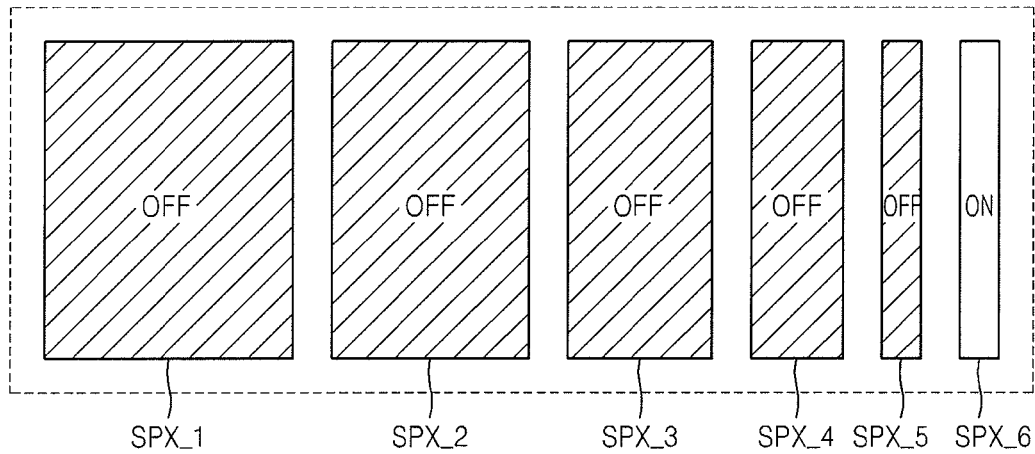
FIGS. 3A to 3E are diagrams showing examples of representing a gradation, according to an embodiment of the present invention.

When one gradation is to be represented, one of the fifth and sixth differential sub-pixels SPX_5 and SPX_6, for example, only the sixth differential sub-pixel SPX_6, is turned-on and emits light as shown in FIG. 3A so that light is emitted by 1/32 of the entire light-emitting area, and the rest of the differential sub-pixels, that is, the first to fifth differential sub-pixels SPX_1 to SPX_5 are turned-off.

Figure 3B:
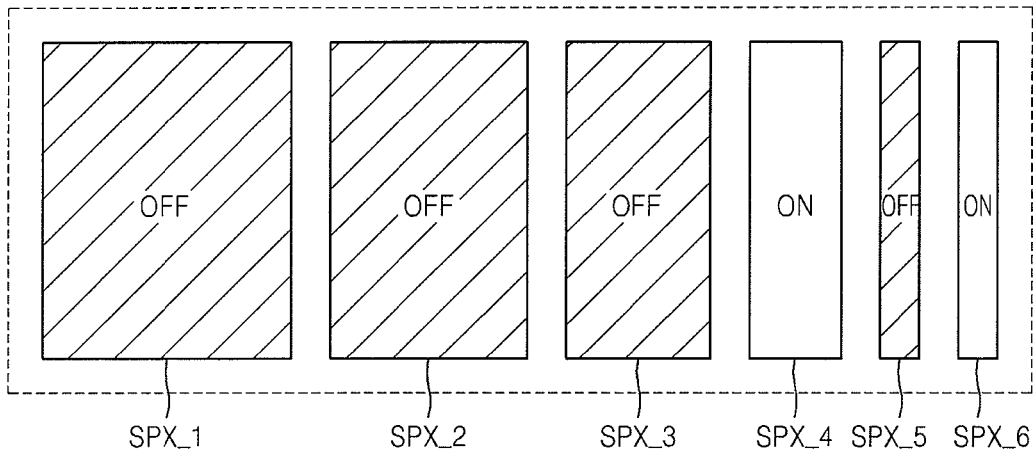

When five gradations are to be represented, one of the fifth and sixth differential sub-pixels SPX_5 and SPX_6, for example, only the sixth differential sub-pixel SPX_6, and the fourth differential sub-pixel SPX_4 are turned-on and emit light as shown in FIG. 3B so that light is emitted by $5/32$ of the entire light-emitting area, and the rest of the differential sub-pixels, that is, the first to third differential sub-pixels SPX_1 to SPX_3 are turned-off.

Figure 3C:
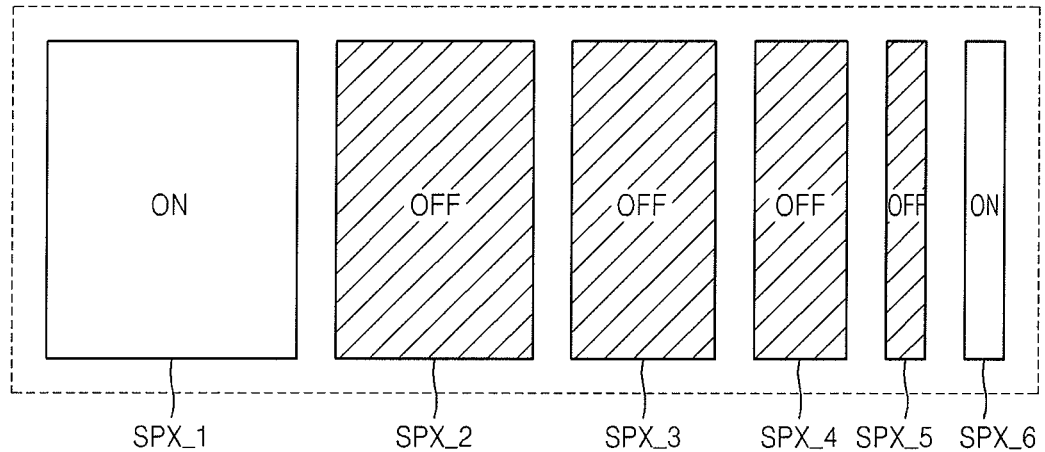

When seventeen gradations are to be represented, one of the fifth and sixth differential sub-pixels SPX_5 and SPX_6, for example, only the sixth differential sub-pixel SPX_6, and the first differential sub-pixel SPX_1 are turned-on and emit light as shown in FIG. 3C so that light is emitted by $17/32$ of the entire light-emitting area, and the rest of the differential sub-pixels, that is, the second to fifth differential sub-pixels SPX_2 to SPX_5 are turned-off.

Figure 3D:
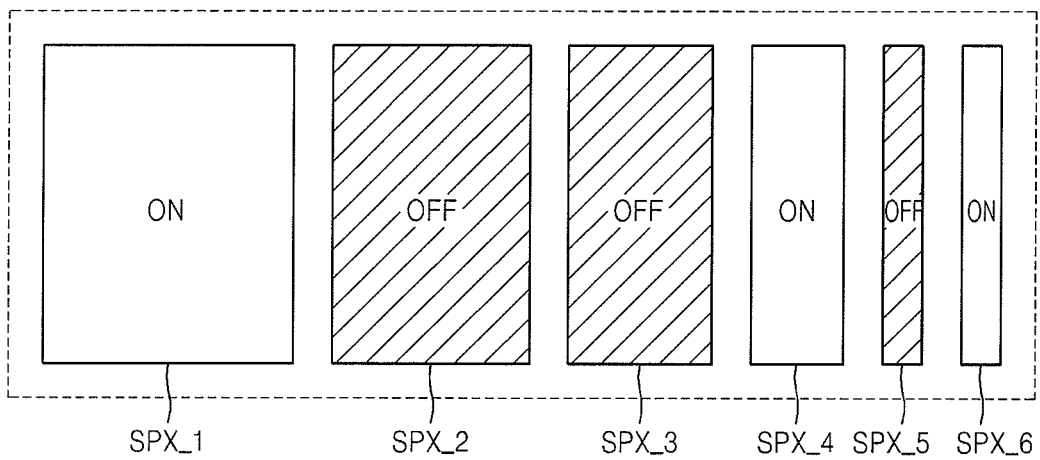

When twenty-one gradations are to be represented, one of the fifth and sixth differential sub-pixels SPX_5 and SPX_6, for example, only the sixth differential sub-pixel SPX_6, the first differential sub-pixel SPX_1, and the fourth differential sub-pixel SPX_4 are turned-on and emit light as shown in FIG. 3D so that light is emitted by $21/32$ of the entire light-emitting area, and the rest of the differential sub-pixels, that is, the second, third, and fifth differential sub-pixels SPX_2, SPX_3, and SPX_5, are turned-off.

Figure 3E:
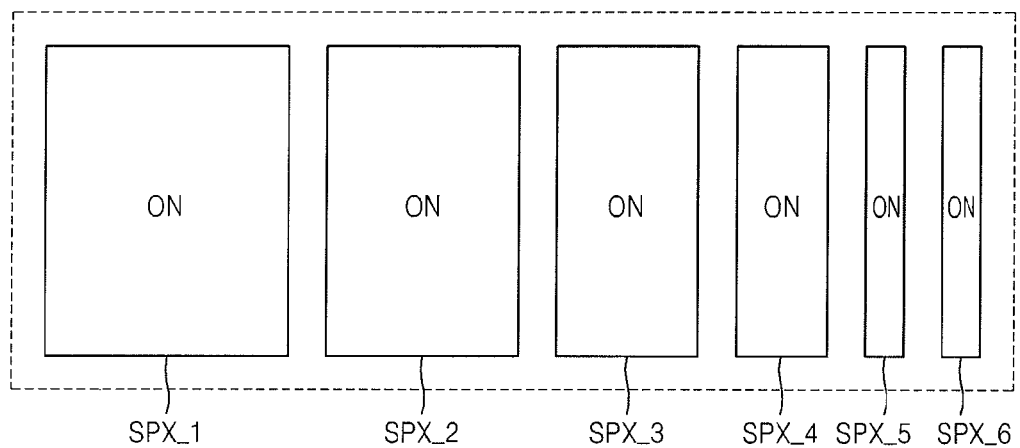

When thirty-two gradations are to be represented, all differential sub-pixels SPX_1 to SPX_6 are turned-on and emit light as shown in FIG. 3E so that light is emitted by the entire light-emitting area.

Figure 4:
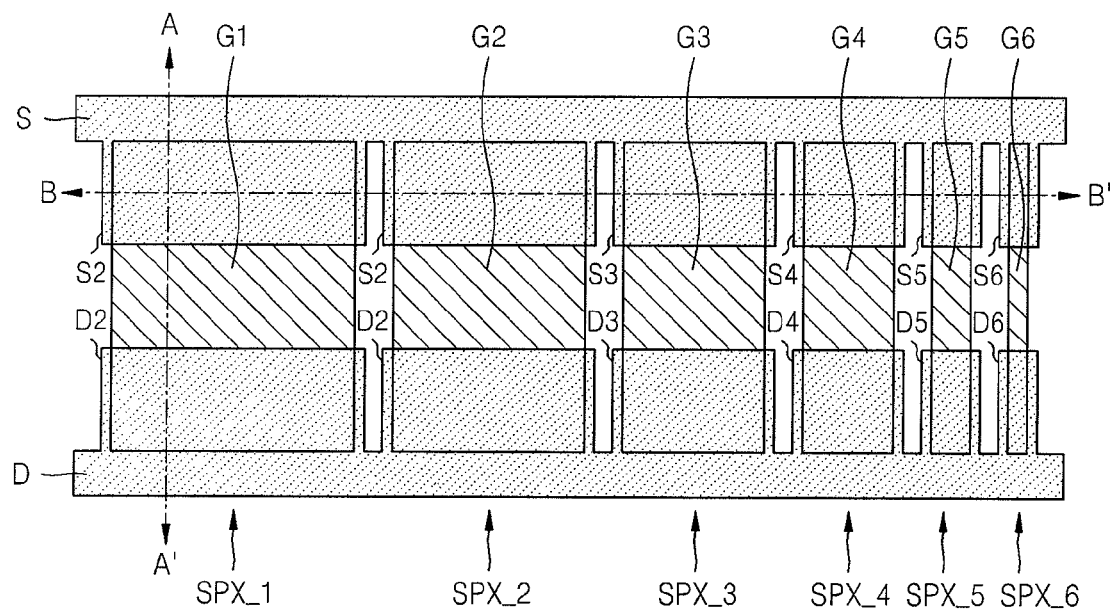
FIG. 4 is a top plan view showing a structure of a pixel according to an embodiment of the present invention.

FIG. 4 is a top plan view showing a structure of a pixel PX according to an embodiment of the present invention.

A single pixel PX is divided into a plurality of differential sub-pixels SPX by using an organic light-emitting transistor (OLET) to represent a gradation. The OLET has both a function as a transistor and a light-emitting function.

Referring to FIG. 4, the pixel PX includes the first to sixth differential sub-pixels SPX_1 to SPX_6 and thus may represent sixty-four gradations. In the current embodiment, although six differential sub-pixels are described, the present invention is not limited thereto, and the number of differential sub-pixels constituting the pixel may vary depending on the number of gradations.

In embodiments, the first to sixth differential sub-pixels SPX_1 to SPX_6 have light-emitting areas different from one another. Each of the first to sixth differential sub-pixels SPX_1 to SPX_6 may be configured as an OLET including a gate electrode, a source electrode, a drain electrode, and an organic thin film layer below the source electrode and the drain electrode. As in the illustrated embodiments, a single organic thin film layer can be used for the first to sixth differential sub-pixels SPX_1 to SPX_6. The organic thin film layer moves charges (carriers, for example, electrons, or holes) and emits light. In the current embodiment, the source electrode and the drain electrode serve as an anode and a cathode of an organic light-emitting diode (OLED), respectively. In other words, if a voltage is applied to the source electrode and the drain electrode and a gate on signal is applied to the gate electrode, a channel is formed in the organic thin film layer, and at the same time, the electrons and the holes move, and thus light is emitted.

Figure 5A:
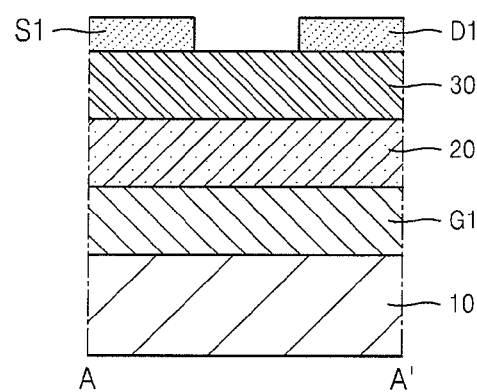
FIGS. 5A and 5B are cross-sectional views taken along line A-A' and line B-B' of FIG. 4, respectively, according to an embodiment of the present invention.
Figure 5B:
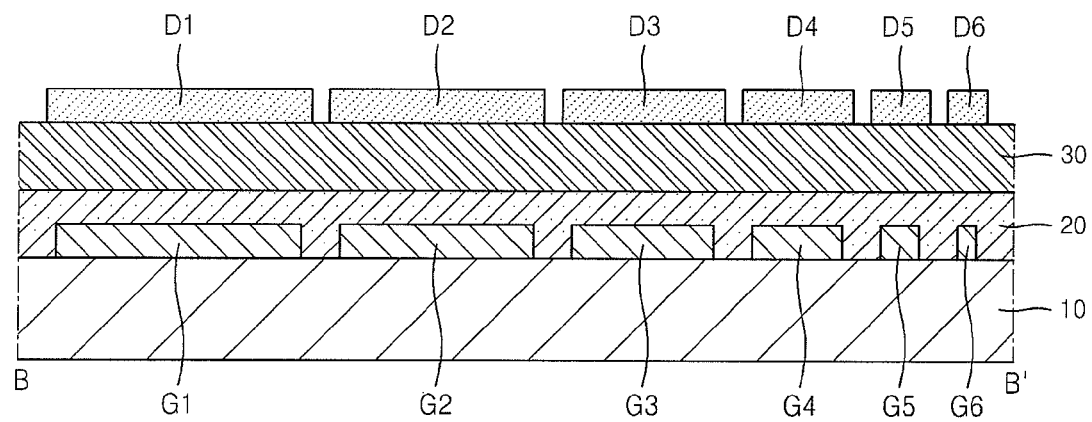

FIGS. 5A and 5B are cross-sectional views taken along line A-A' and line B-B' of FIG. 4, respectively, according to an embodiment of the present invention.

Referring to FIGS. 5A and 5B, a plurality of gate electrodes G1 to G6 are formed in the first to sixth differential sub-pixels SPX_1 to SPX_6 on a substrate 10. The substrate 10 may be a hard substrate or a flexible substrate formed of, for example, glass, quartz, polyethylene, polypropylene, polyethylene terephthalate, polymethacrylate, polymethyl methacrylate; polymethyl acrylate, polyester, or polycarbonate. An auxiliary layer (not shown) such as a barrier layer, a blocking layer, and/or a buffer layer may further be formed on the substrate 10 to prevent diffusion of impurity ions, prevent moisture or external air from penetrating, and planarize a surface of the substrate 10. The auxiliary layer may be formed of an inorganic material, such as $SiO_2$ and/or $SiN_x$.

The gate electrodes G1 to G6 have different areas and are arranged to be adjacent to one another. The size of a space between the adjacent gate electrodes may be determined according to characteristics of devices and panels. The gate electrodes G1 to G6 may be formed of a metal or a conductive high molecular weight material. The metal for forming the gate electrodes G1 to G6 may be, for example, aluminum (Al), silver (Ag), molybdenum (Mo), copper (Cu), or titanium (Ti). For dual light-emission, a transparent electrode formed of indium tin oxide (ITO), indium zinc oxide (IZO), $SnO_2$, or ZnO may be used. The conductive high molecular weight material for forming the gate electrodes G1 to G6 may be, for example, polyaniline, polyacetylene, a polyalkylthiophene derivative, or a polysilane derivative.

An insulation film (which can be also called as gate insulating film in the specification) 20 is formed on the gate electrodes G1 to G6. The gate insulating film 20 may be formed of an inorganic material, such as $SiO_2$, $SiN_x$, or $Al_2O_3$, or an organic material, such as polychloroprene, polyethylene terephthalate, polyoxymethylene, polyvinyl chloride, polyvinylidene fluoride, cyanoethylpullulan, polymethyl methacrylate, polyvinylphenol, polysulfone, polycarbonate, or polyimide.

An organic thin film layer 30 serving as an active layer (AL) and an emitting material layer (EML) is formed on the gate insulating film 20. The organic thin film layer 30 may be formed of a material having an excellent charge mobility and emission properties. The organic thin film layer 30 may be formed by vacuum evaporation, spin coating, dip coating, ink-jet printing, stamping, or the like.

When the OLET is a homo-type OLET in which the AL emits light, the organic thin film layer 30 serves as the AL and the EML. In this case, the organic thin film layer 30 may be formed of a unipolar material, such as tetracene.

When the OLET is a hetero-type OLET, the organic thin film layer 30 may have a structure including a hole transporting layer (HTL) or an electron transporting layer (ETL) over or below the EML. At this time, the HTL or the ETL may serve as the AL according to which carrier is controlled. For example, the ETL may serve as an AL including an n-type organic semiconductor material, and the HTL may serve as an AL including a p-type organic semiconductor.

Figure 6A:
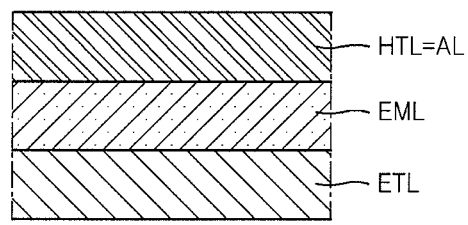
FIGS. 6A and 6B are schematic cross-sectional views showing a structure of an organic thin film layer according to an embodiment of the present invention.
Figure 6B:
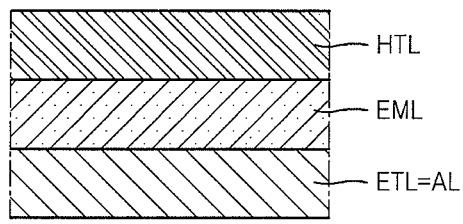

FIGS. 6A and 6B are schematic cross-sectional views showing structures of the organic thin film layer 30, according to embodiments of the present invention. FIG. 6A shows an example where the HTL is the AL, and FIG. 6B shows an example where the ETL is the AL. In this case, the HTL may be a material including DH4T, the EML may be a material including Alq3-DCM, and the ETL may be a material including DFH-4T.

Here, the ETL may include an electron injection layer (EIL), and the HTL may include a hole injection layer (HIL).

A plurality of source electrodes S1 to S6 and a plurality of drain electrodes D1 to D6 are separately formed to face each other, respectively. In embodiments, the plurality of source electrodes S1 to S6 have predetermined areas corresponding to the areas of the gate electrodes G1 to G6. The plurality of drain electrodes D1 to D6 have predetermined areas corresponding to the areas of the gate electrodes G1 to G6. Here, the source electrodes S1 to S6 may extend from a source line S and the drain electrodes D1 to D6 may extend from a drain line D.

The source electrodes S1 to S6 and the drain electrodes D1 to D6 may be properly selected according to materials of layers contacting the source electrodes S1 to S6 and the drain electrodes D1 to D6. The source electrodes S1 to S6 and the drain electrodes D1 to D6 may be formed of at least one selected from among Al, platinum (Pt), palladium (Pd), Ag, magnesium (Mg), gold (Au), nickel (Ni), neodymium (Nd), iridium (Ir), chromium (Cr), lithium (Li), or calcium (Ca), Mo, Ti, tungsten (W), and Cu, or a combination thereof, and the source electrodes S1 to S6 and the drain electrodes D1 to D6 may be formed to have a single-layered structure or a multi-layered structure.

Figure 7A:
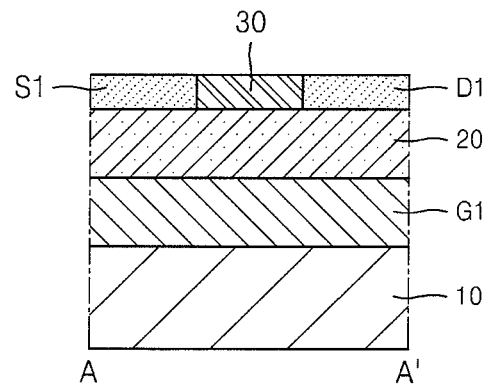
FIGS. 7A to 7C are cross-sectional views taken along line A-A' and line B-B' of FIG. 4, respectively, according to another embodiment of the present invention.
Figure 7B:
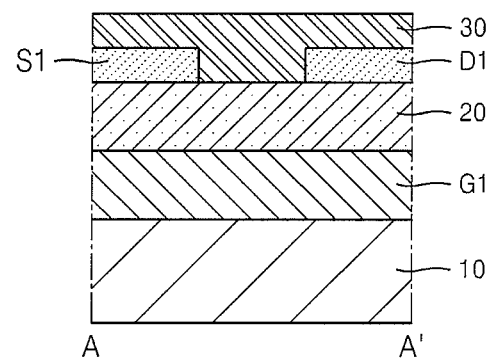
Figure 7C:
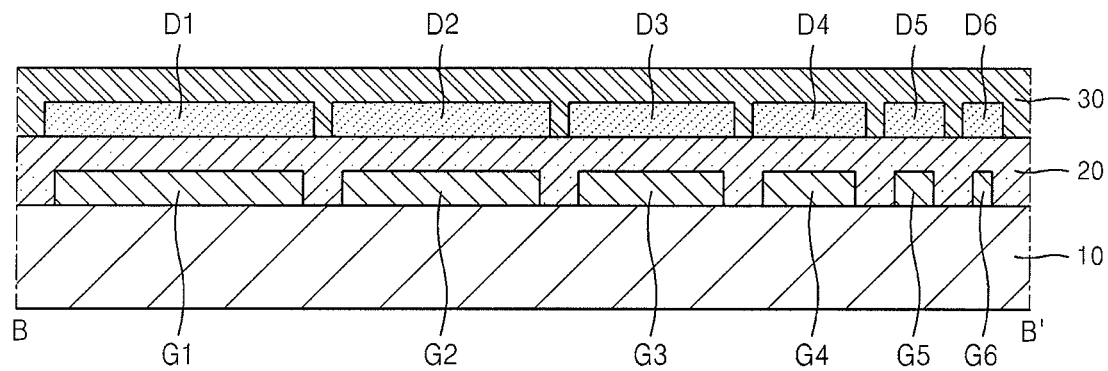

FIGS. 7A and 7B are cross-sectional views taken along line A-A' and line B-B' of FIG. 4, according to another embodiment of the present invention. FIG. 7C is a cross-sectional view taken along line B-B' of FIG. 4 according to another embodiment of the present invention.

FIGS. 7A to 7C are different from FIGS. 5A and 5B in that the organic thin film layer 30 is formed in the same level or elevation as the source electrodes S1 to S6 and the drain electrodes D1 to D6. FIG. 7A shows an example where the organic thin film layer 30 is formed between the drain electrodes D1 to D6 are and the source electrodes S1 to S6, and is formed in the same level as the source electrodes S1 to S6 and the drain electrodes D1 to D6. FIGS. 7B and 7C show examples where the organic thin film layer 30 is formed to fill gaps between the source electrodes S1 to S6 and the drain electrodes D1 to D6 and to cover the source electrodes S1 to S6 and the drain electrodes D1 to D6. Hereinafter, a repeated description of the same features described with respect to FIGS. 5A and 5B is omitted.

Referring to FIGS. 7A to 7C, the gate electrodes G1 to G6 are formed on the substrate 10. The gate insulating film 20 is formed on the gate electrodes G1 to G6. The source electrodes S1 to S6 and the drain electrodes D1 to D6 are formed spaced apart from one another to face each other in the same level on the gate insulating film 20. The organic thin film layer 30 serving as the AL and the EML is formed on the source electrodes S1 to S6 and the drain electrodes D1 to D6. In embodiments, the organic thin film layer 30 is formed in the same level or elevation as the source electrodes S1 to S6 and the drain electrodes D1 to D6 and between the source electrodes S1 to S6 and the drain electrodes D1 to D6. In some embodiments, the organic thin film layer 30 may further include a portion that covers the source electrodes S1 to S6 and the drain electrodes D1 to D6. The organic thin film layer 30 may be a homo-type or hetero-type organic thin film layer.

Figure 8:
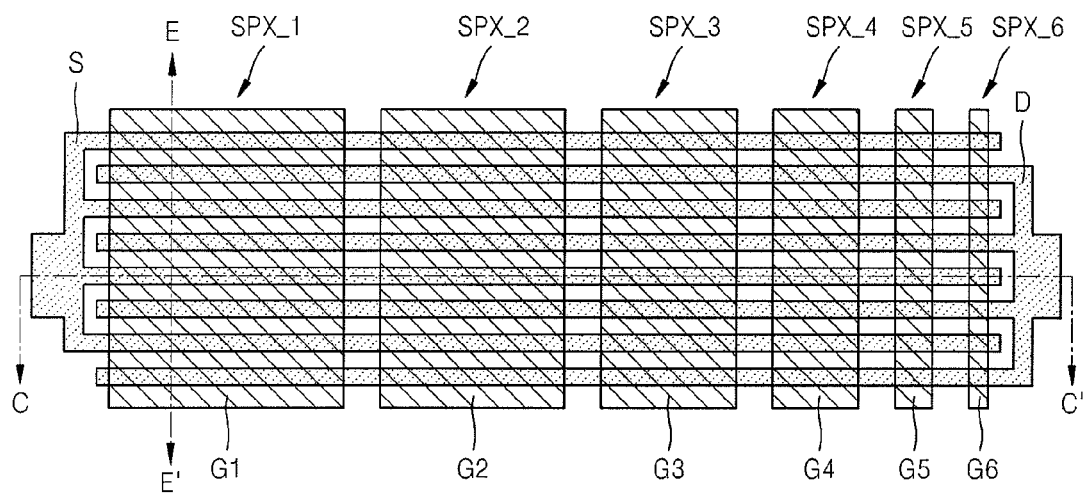
FIG. 8 is a top plan view showing a structure of a pixel according to another embodiment of the present invention.

FIG. 8 is a top plan view showing a structure of a pixel PX according to another embodiment of the present invention.

The pixel PX is divided into the plurality of differential sub-pixels SPX by using an OLET to represent a gradation. The OLET has both a function as a transistor and a light-emitting function.

Referring to FIG. 8, the pixel PX includes the first to sixth differential sub-pixels SPX_1 to SPX_6 and thus may represent sixty-four gradations. In the current embodiment, although six differential sub-pixels are described, the present invention is not limited thereto, and the number of differential sub-pixels constituting a pixel may vary depending on the number of gradations.

The first to sixth differential sub-pixels SPX_1 to SPX_6 have different light-emitting areas. Each of the first to sixth differential sub-pixels SPX_1 to SPX_6 may be configured as an OLET including a gate electrode, source electrode lines, drain electrode lines and an organic thin film layer below the source electrode and the drain electrode. As in the illustrated embodiments, a single organic thin film layer may be used for the first to sixth differential sub-pixels SPX_1 to SPX_6. The organic thin film layer moves charges (carriers, for example, electrons, or holes) and emits light. As in the illustrated embodiments, a source electrode may have a plurality of source electrode lines and a drain electrode may have a plurality of drain electrode lines, and the source and drain electrode lines may extend over the gate electrodes of the first to sixth differential sub-pixels SPX_1 to SPX_6. The source electrode lines and the drain electrode lines are alternately disposed. A channel separation between the source electrode and the drain electrode may be properly selected in consideration of luminance efficiency. In the current embodiment, the source electrode and the drain electrode may serve as an anode or a cathode of an OLED.

Figure 9A:
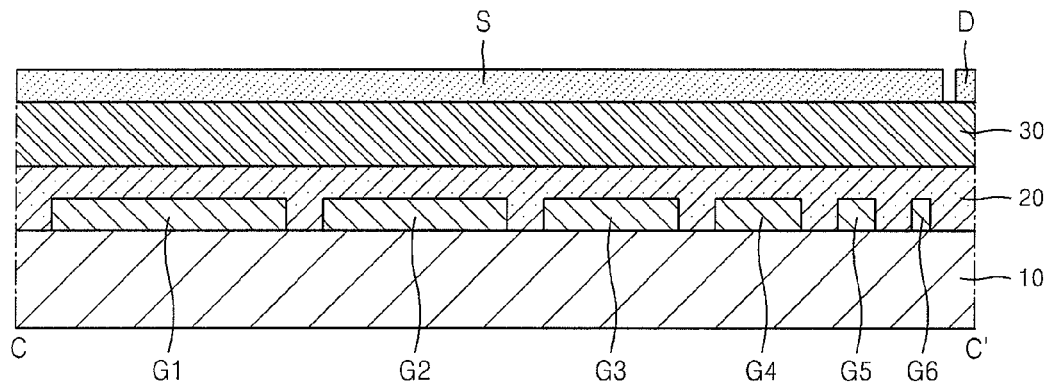
FIGS. 9A and 9B are cross-sectional views taken along line C-C' and line E-E' of FIG. 8, respectively, according to an embodiment of the present invention.
Figure 9B:
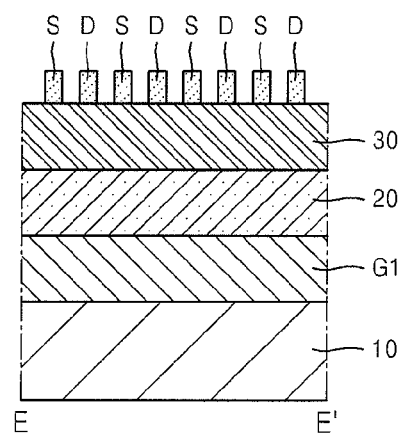

FIGS. 9A and 9B are cross-sectional views taken along line C-C' and line E-E' of FIG. 8, respectively, according to an embodiment of the present invention.

Referring to FIGS. 9A and 9B, the plurality of gate electrodes G1 to G6 are formed in the first to sixth differential sub-pixels SPX_1 to SPX_6 on the substrate 10. The substrate 10 may be a hard substrate or a flexible substrate formed of, for example, glass, quartz, polyethylene, polypropylene, polyethylene terephthalate, polymethacrylate, polymethyl methacrylate, polymethyl acrylate, polyester, or polycarbonate. An auxiliary layer (not shown) such as a barrier layer, a blocking layer, and/or a buffer layer may further be formed on the substrate 10 to prevent diffusion of impurity ions, prevent penetration of moisture or external air, and planarize a surface of the substrate 10. The auxiliary layer may be formed of an inorganic material, such as $SiO_2$ and/or $SiN_x$.

The gate electrodes G1 to G6 have different areas and are arranged to be adjacent to one another. The gate electrodes G1 to G6 may be formed of a metal or a conductive high molecular weight material. The metal for forming the gate electrodes G1 to G6 may be, for example, Al, Ag, Mo, Cu, or Ti. For dual light-emission, a transparent electrode formed of ITO, IZO, $SnO_2$, or ZnO may be used. The conductive high molecular weight material for forming the gate electrodes G1 to G6 may be, for example, polyaniline, polyacetylene, a polyalkylthiophene derivative, or a polysilane derivative.

The gate insulating film 20 is formed on the gate electrodes G1 to G6. The gate insulating film 20 may be formed of an inorganic material, such as $SiO_2$, $SiN_x$, or $Al_2O_3$, or an organic material, such as polychloroprene, polyethylene terephthalate, polyoxymethylene, polyvinyl chloride, polyvinylidene fluoride, cyanoethylpullulan, polymethyl methacrylate, polyvinylphenol, polysulfone, polycarbonate, or polyimide.

The organic thin film layer 30 serving as an AL and an EML is formed on the gate insulating film 20. The organic thin film layer 30 may be formed of a material having an excellent charge mobility and emission properties. The organic thin film layer 30 may be formed by vacuum evaporation, spin coating, dip coating, ink-jet printing, stamping, or the like.

When the OLET is a homo-type OLET in which the AL emits light, the organic thin film layer 30 serves as the AL and the EML. In this case, the organic thin film layer 30 may be formed of a unipolar material, such as tetracene.

When the OLET is a hetero-type OLET, the organic thin film layer 30 may have a structure including an HTL or an ETL around the EML. At this time, the HTL or the ETL may serve as the AL according to which carrier is controlled. The HTL may be a material including DH4T, the EML may be a material including Alq3-DCM, and the ETL may be a material including DFH-4T.

Here, the ETL may include an EIL, and the HTL may include an HIL.

A plurality of source electrode lines S and a plurality of drain electrode lines D are alternately arranged and spaced apart from one another on the organic thin film layer 30 to face each other on the same level or elevation. The source electrode lines S are disposed spaced apart from one another at substantially equal intervals on the organic thin film layer 30 and extend to cross the gate electrodes G1 to G6. The drain electrode lines D are disposed between the source electrode lines S.

The source electrode S and the drain electrode D may be properly selected according to materials of layers contacting the source electrode S and the drain electrode D. The source electrode S and the drain electrode D may be formed of at least one selected from among Al, Pt, Pd, Ag, Mg, Au, Ni, Nd, Ir, Cr, Li, or Ca, Mo, Ti, W, and Cu, or a combination thereof, and the source electrode S and the drain electrode D may be formed to have a single-layered structure or a multi-layered structure.

Figure 10A:
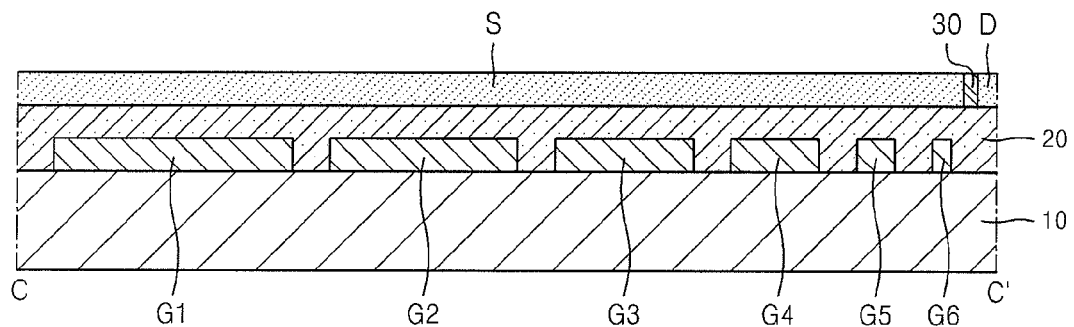
FIGS. 10A and 10B are cross-sectional views taken along line C-C' and line E-E' of FIG. 8, respectively, according to another embodiment of the present invention.
Figure 10B:
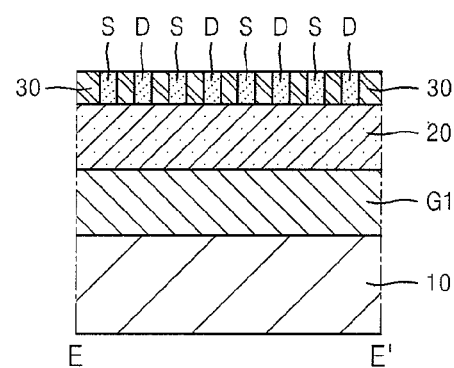

FIGS. 10A and 10B are cross-sectional views taken along line C-C' and line E-E' of FIG. 8, respectively, according to another embodiment of the present invention.

FIGS. 10A and 10B are different from FIGS. 9A and 9B in that the organic thin film layer 30 shown in FIGS. 10A and 10B is formed in the same level as the source electrodes S and the drain electrodes D. The organic thin film layer 30 may be formed in the same level as the source electrodes S and the drain electrodes D and between the source electrodes S and the drain electrodes D. Alternatively, the organic thin film layer 30 may be formed to fill the gaps between the source electrodes S and the drain electrodes D and to cover the source electrodes S and the drain electrodes D. Hereinafter, a repeated description of the same features described with respect to FIGS. 9A and 9B is omitted.

Referring to FIGS. 10A and 10B, the gate electrodes G1 to G6 are formed on the substrate 10. The gate insulating film 20 is formed on the gate electrodes G1 to G6. The source electrode lines S are disposed spaced apart from one another at equal intervals to cross the gate electrodes G1 to G6. The drain electrode lines D are disposed between the source electrode lines S on the gate insulating film 20. The organic thin film layer 30 serving as the AL and the EML is formed between the source electrode lines S and the drain electrode lines D. The organic thin film layer 30 may be formed in the same level as the source electrode lines S and the drain electrode lines D and between the source electrode lines S and the drain electrode lines D, or may be formed in the same level as the source electrode lines S and the drain electrode lines D and cover the source electrode lines S and the drain electrode lines D. The organic thin film layer 30 may be a homo-type or hetero-type organic thin film layer.

Figure 11:
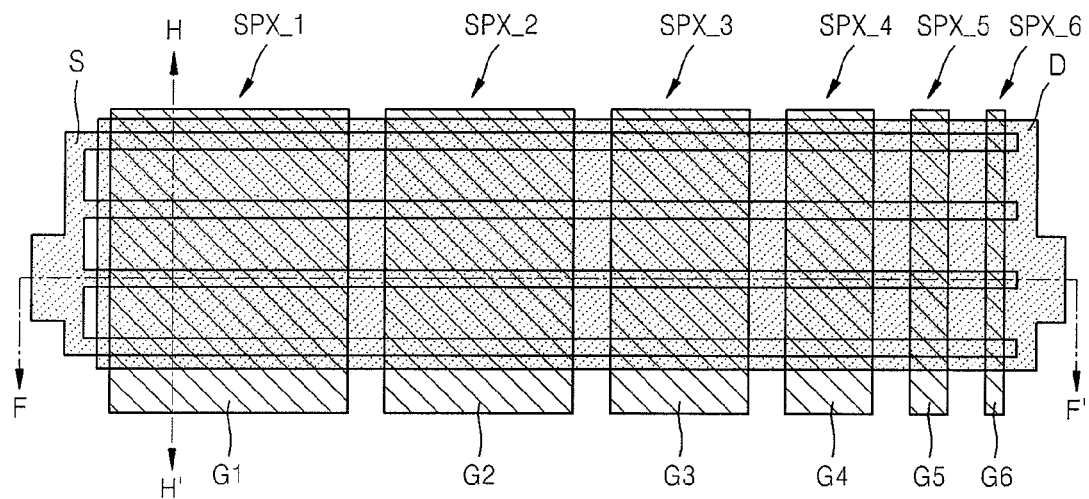
FIG. 11 is a top plan view showing a structure of a pixel according to another embodiment of the present invention.

FIG. 11 is a top plan view showing a structure of a pixel PX according to another embodiment of the present invention.

The single pixel PX is divided into the plurality of differential sub-pixels SPX by using an OLET to represent a gradation. The OLET has both a function as a transistor and a light-emitting function.

Referring to FIG. 11, the pixel PX includes the first to sixth differential sub-pixels SPX_1 to SPX_6 and thus may represent sixty-four gradations. In the current embodiment, although six differential sub-pixels are described, the present invention is not limited thereto, and the number of differential sub-pixels constituting the pixel may vary depending on the number of gradations.

Figure 13:
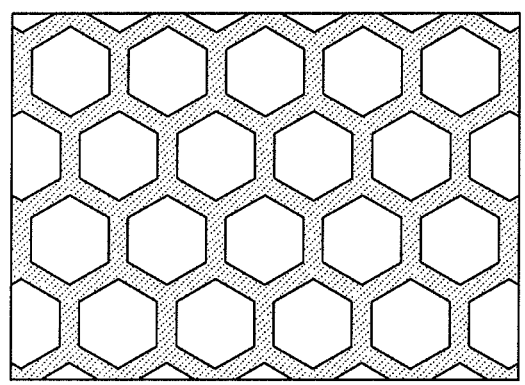
FIG. 13 is a diagram showing an electrode pattern of a source electrode, according to another embodiment of the present invention.
Figure 14:
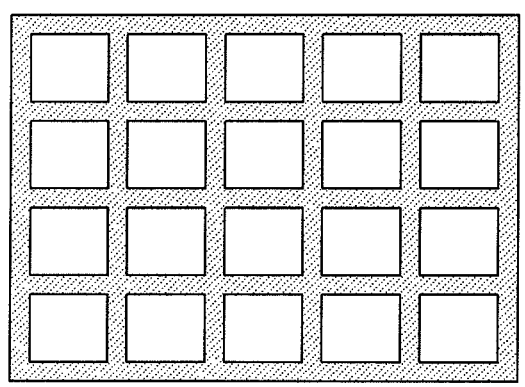
FIG. 14 is a diagram showing an electrode pattern of a source electrode, according to another embodiment of the present invention.

The first to sixth differential sub-pixels SPX_1 to SPX_6 have different light-emitting areas. Each of the first to sixth differential sub-pixels SPX_1 to SPX_6 may be configured as an OLET including a gate electrode, a source electrode, a drain electrode and an organic thin film layer between a source electrode and a drain electrode. As in the illustrated embodiments, a single organic thin film layer may be used for the first to sixth differential sub-pixels SPX_1 to SPX_6. The organic thin film layer moves charges (carriers, for example, electrons, or holes) and emits light. As in the illustrated embodiments, a source electrode may have a plurality of source electrodes extending over the gate electrodes of the first to sixth differential sub-pixels SPX_1 to SPX_6. The source electrode S is formed in such a way that a plurality of electrode lines are spaced apart from one another in parallel, and the drain electrode D is disposed above the source electrode S. In the current embodiment, although the source electrode lines are disposed in parallel, the present invention is not limited thereto, and the source electrode lines S may be formed in various patterns according to structures of the source electrodes. FIGS. 13 and 14 show patterns of the source electrodes S according to other embodiments of the present invention. The source electrode S may be formed in a honeycomb pattern as shown in FIG. 13, and the source electrode S may be formed in a lattice pattern as shown in FIG. 14.

In the current embodiment, the AL and the drain electrode D connected to the source electrode S may serve as any one of an anode and a cathode of the OLED.

Figure 12A:
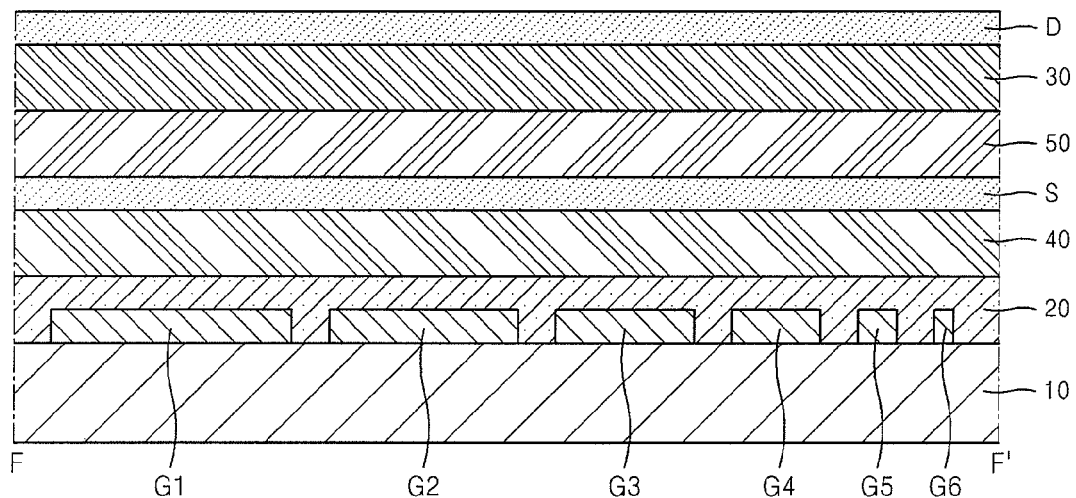
FIGS. 12a and 12b are cross-sectional views taken along line F-F' and line H-H' of FIG. 11, respectively, according to an embodiment of the present invention.
Figure 12B:
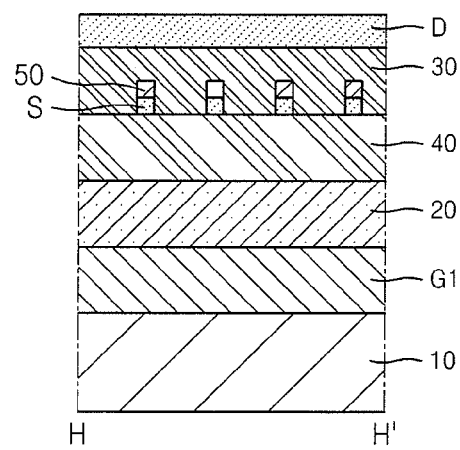

FIGS. 12a and 12b are cross-sectional views taken along line F-F' and line H-H' of FIG. 11, respectively, according to an embodiment of the present invention.

Referring to FIGS. 12A and 12B, the gate electrodes G1 to G6 are formed in the first to sixth differential sub-pixels SPX_1 to SPX_6 on the substrate 10. The substrate 10 may be a hard substrate or a flexible substrate formed of, for example, glass, quartz, polyethylene, polypropylene, polyethylene terephthalate, polymethacrylate, polymethyl methacrylate, polymethyl acrylate, polyester, or polycarbonate. An auxiliary layer (not shown) such as a barrier layer, a blocking layer, and/or a buffer layer may further be formed on the substrate 10 to prevent diffusion of impurity ions, prevent penetration of moisture or external air, and planarize a surface of the substrate 10. The auxiliary layer may be formed of an inorganic material, such as $SiO_2$ and/or $SiN_x$.

The gate electrodes G1 to G6 have different areas and are arranged to be adjacent to one another. The gate electrodes G1 to G6 may be formed of a metal or a conductive high molecular weight material. The metal for forming the gate electrodes G1 to G6 may be, for example, Al, Ag, Mo, Cu, or Ti. For dual light-emission, a transparent electrode formed of ITO, IZO, $SnO_2$, or ZnO may be used. The conductive high molecular weight material for forming the gate electrodes G1 to G6 may be, for example, polyaniline, polyacetylene, a polyalkylthiophene derivative, or a polysilane derivative.

The gate insulating film 20 is formed on the gate electrodes G1 to G6. The gate insulating film 20 may be formed of an inorganic material, such as $SiO_2$, $SiN_x$, or $Al_2O_3$, or an organic material, such as polychloroprene, polyethylene terephthalate, polyoxymethylene, polyvinyl chloride, polyvinylidene fluoride, cyanoethylpullulan, polymethyl methacrylate, polyvinylphenol, polysulfone, polycarbonate, or polyimide.

An AL 40 is formed on the gate insulating film 20. The AL 40 may be formed of an inorganic semiconductor such as amorphous silicon or poly silicon, or an organic semiconductor.

The source electrodes S are disposed on the AL 40 to be spaced apart from one another at equal intervals in parallel and to cross the gate electrodes G1 to G6.

A plurality of insulating films 50 are formed on the source electrodes S, respectively. The insulating films 50 serve as barrier layers to prevent charges from directly moving to the drain electrodes D. The insulating films 50 may be formed of an inorganic material, such as $SiO_2$, $SiN_x$, or $Al_2O_3$, or an organic material, such as polychloroprene, polyethylene terephthalate, polyoxymethylene, polyvinyl chloride, polyvinylidene fluoride, cyanoethylpullulan, polymethyl methacrylate, polyvinyl phenol, polysulfone, polycarbonate, or polyimide, similar to the gate insulating film 20.

The organic thin film layer 30 serving as the EML is formed on the insulating films 50 to fill gaps between the source electrodes S. The organic thin film layer 30 may be formed of a material having an excellent charge mobility and emission properties. The organic thin film layer 30 may include an EML, and an ETL and a HTL that are disposed around the EML. The organic thin film layer 30 may be formed by vacuum evaporation, spin coating, dip coating, ink-jet printing, stamping, or the like.

The drain electrode D is formed on the organic thin film layer 30 across the entire surface of the substrate 10 to be commonly formed on the gate electrodes G1 to G6.

The source electrodes S and the drain electrode D may be properly selected according to materials of layers contacting the source electrodes S and the drain electrode D. The source electrodes S and the drain electrode D may be formed of at least one selected from among Al, Pt, Pd, Ag, Mg, Au, Ni, Nd, Ir, Cr, Li, or Ca, Mo, Ti, W, and Cu, or a combination thereof, and the source electrodes S and the drain electrode D may be formed to have a single-layered structure or a multi-layered structure.

According to one or more embodiments of the present invention, a digital driving is introduced by dividing a single pixel into a plurality of sub-pixels by using an OLET, and thus disadvantages of an analog driving may be remedied. In other words, since a time for compensating for a threshold voltage Vth in the analog driving is not necessary, a demultiplexer (DEMUX) may be used in the pixel. Also, if a single pixel is formed of two OLETs, a 3D image may be displayed without of a resolution limitation.

In the one or more embodiments of the present invention, although a bottom gate-type OLET constitutes the pixel, any of various other OLETs including a top gate-type OLET may constitute the pixel.

In embodiments of the preset invention, a single pixel is divided into a plurality of differential sub-pixels by using the OLET, and a gradation is represented by using a combination of on/off operations of the differential sub-pixels, so that non-uniformity of brightness due to dispersion of a threshold voltage Vth, which is a problem of a analog-type panel, may be resolved.

While embodiments of the present invention have been particularly shown and described, it will be understood by those of ordinary skill in the art that various changes in form and details may be made therein without departing from the spirit and scope of the present invention as defined by the following claims.

What is claimed is:

1. An organic light-emitting transistor device comprising:
   a plurality of gate electrodes that are electrically independent from each other, wherein at least two of the plurality of gate electrodes have substantially different gate areas from one another;
   a source electrode comprising a plurality of source portions that are electrically interconnected;
   a drain electrode comprising a plurality of drain portions that are electrically interconnected;
   an insulation film on the plurality of gate electrodes, the insulation film separating the plurality of gate electrodes from the plurality of source portions and the plurality of drain portions; and
   an organic thin film layer on the insulation film, the organic thin film layer comprising an organic light-emitting material and contacting the insulation film,
   wherein the plurality of gate electrodes overlap the plurality of source portions of the source electrode and the plurality of drain portions of the drain electrode when viewed in a direction perpendicular to a major surface of a substrate,
   wherein the organic thin film layer comprising the organic light-emitting material contacts the plurality of source portions and the plurality of drain portions.

2. The organic light-emitting transistor device of claim 1, wherein the organic thin film layer comprising the organic light-emitting material is between the insulation film and the source portions and between the insulation film and the drain portions, wherein each gate electrode overlaps a corresponding one of the source portions and a corresponding one of the drain portions when viewed in the direction, and wherein each of the drain portions faces a corresponding one of the source portions,
   wherein the source portions and the drain portions have different areas according to the gate area of the corresponding one of the plurality of gate electrodes.

3. The organic light-emitting transistor device of claim 1, wherein the organic thin film layer comprising the organic light-emitting material comprises at least a portion disposed in gaps between the source portions and the drain portions.

4. The organic light-emitting transistor device of claim 1, wherein the organic thin film layer comprises an emitting material layer comprising the organic light-emitting material and an active layer.

5. The organic light-emitting transistor device of claim 4, wherein the organic thin film layer further comprises an electron transport layer and a hole transport layer, wherein the emitting material layer is disposed between the electron transport layer and the hole transport layer, wherein the electron transport layer or the hole transport layer is the active layer.

6. The organic light-emitting transistor device of claim 1, wherein the organic thin film layer comprising the organic light-emitting material is between the insulation film and the source portions and between the insulation film and the drain portions, wherein the drain portions and the source portions are alternately disposed and overlap with two or more of the plurality of gate electrodes when viewed in the direction.

7. The organic light-emitting transistor device of claim 1, wherein the organic light-emitting transistor device is configured such that electric current flows selectively between at least one of the plurality of source portions and at least one of the plurality of drain portions via the organic thin film layer when at least one of the plurality of gate electrodes is activated.

8. An organic light-emitting display apparatus comprising:
   a scan driver configured to supply scan signals to a plurality of scan lines;
   a data driver configured to supply data signals to a plurality of data lines; and
   a plurality of pixels formed near intersections between the scan lines and the data lines, each pixel comprising the organic light-emitting transistor device of claim 1,
   wherein each of the pixels comprises a plurality of sub-pixels that correspond to the plurality of gate electrodes, wherein each sub-pixel is configured to be selectively turned-on and turned-off by the scan signals and data signals to represent a number of different brightness levels.

9. The organic light-emitting display apparatus of claim 8, wherein the gate electrodes of the pixel are configured to be selectively turned-on by the data signals to thus selectively turn on the sub-pixels.

10. The organic light-emitting display apparatus of claim 8, wherein when the number of the gate electrodes in each pixel is N (wherein, N is a natural number), the number of different brightness levels to be represented is $2^N$.

11. The organic light-emitting display apparatus of claim 10, wherein the brightness of one of the brightness levels corresponds to the sum of light-emitting areas of the turned-on sub-pixels.

12. The organic light-emitting display apparatus of claim 8, wherein the plurality of source portions have predetermined areas corresponding to the areas of the plurality of gate electrodes, respectively, and are spaced apart from one another, wherein the plurality of drain portions have predetermined areas corresponding to areas of the plurality of gate electrodes, respectively, and are spaced apart from one another, wherein each of the plurality of drain portions faces a corresponding one of the plurality of source portions.

13. The organic light-emitting display apparatus of claim 8, wherein the plurality of source portions are disposed over the gate electrodes and spaced apart from one another at substantially equal intervals in parallel and cross the plurality of gate electrodes, wherein the plurality of drain portions and the plurality of source portions are alternately disposed and cross two or more of the plurality of gate electrodes.

14. An organic light-emitting transistor device comprising:
a plurality of gate electrodes that are electrically independent from each other, wherein at least two of the plurality of gate electrodes have substantially different gate areas from one another;
a first insulation film on the plurality of gate electrodes;
an active layer on the first insulation film;
a source electrode comprising a plurality of source portions that are electrically interconnected and disposed on the active layer;
a second insulation film on the source electrode;
an organic thin film layer formed on the second insulation film, the organic thin film layer comprising an organic light-emitting material and contacting the second insulation film; and
a drain electrode on the organic thin film layer,
wherein the drain electrode overlaps the plurality of source portions and further overlaps the plurality of gate electrodes.

15. The organic light-emitting transistor device of claim 14, wherein the organic thin film layer comprises an emitting material layer comprising the organic light-emitting material, and an electron transport layer and a hole transport layer, wherein the emitting material layer is disposed between the electron transport layer and the hole transport layer.

16. The organic light-emitting transistor device of claim 14, wherein the plurality of source portions are spaced apart from one another at substantially equal intervals in parallel and cross the gate electrodes.

17. The organic light-emitting transistor device of claim 14, wherein the plurality of source portions are arranged over the active layer in a honeycomb pattern or a lattice pattern.

18. An organic light-emitting display apparatus comprising:
a scan driver configured to supply scan signals to a plurality of scan lines;
a data driver configured to supply data signals to a plurality of data lines; and
a plurality of pixels formed near intersections between the scan lines and the data lines, each pixel comprising the organic light-emitting transistor device of claim 14,
wherein each of the pixels comprises a plurality of sub-pixels that correspond to the plurality of gate electrodes,
wherein each sub-pixel is configured to be selectively turned-on and turned-off by the scan signals and the data signals to represent a number of different brightness levels.

19. The organic light-emitting display apparatus of claim 18, wherein the gate electrodes of the pixel are configured to be selectively turned-on by the data signals to thus selectively turn on the sub-pixels.

20. The organic light-emitting display apparatus of claim 18, wherein when the number of the gate electrodes in each pixel is N (wherein, N is a natural number), the number of different brightness levels to be represented is $2^N$.

21. The organic light-emitting display apparatus of claim 18, wherein the brightness of one of the brightness levels corresponds to the sum of light-emitting areas of the turned-on sub-pixels.

* * * * *